United States Patent [19]

Lin et al.

[11] 4,128,891
[45] Dec. 5, 1978

[54] MAGNETIC BUBBLE DOMAIN RELATIONAL DATA BASE SYSTEM

[75] Inventors: Yeong S. Lin, Mt. Kisco; Chao N. Liu, Yorktown Heights; Donald T. Tang, Mt. Kisco, all of N.Y.

[73] Assignee: International Business Machines Corporation, Armonk, N.Y.

[21] Appl. No.: 755,892

[22] Filed: Dec. 30, 1976

[51] Int. Cl.$^2$ .................. G06F 7/00; G06F 13/00; G11C 11/14; G11C 19/08
[52] U.S. Cl. .................. 364/900; 365/15
[58] Field of Search ... 364/900 MS File, 200 MS File; 340/174 TF; 365/13, 14, 15

[56] References Cited

U.S. PATENT DOCUMENTS

| | | | |
|---|---|---|---|
| 3,541,522 | 11/1970 | Bobeck et al. | 364/900 |
| 3,750,106 | 7/1973 | Caron | 364/900 |
| 3,831,152 | 8/1974 | Perneski et al. | 364/900 |
| 3,879,585 | 4/1975 | Bobeck et al. | 340/174 TF X |
| 3,906,455 | 9/1975 | Houston et al. | 364/200 |
| 3,930,244 | 12/1975 | Voegeli | 340/174 TF |
| 3,967,263 | 6/1976 | Chang et al. | 364/900 |
| 3,997,880 | 12/1976 | Chen et al. | 364/900 |
| 4,037,205 | 7/1977 | Edelberg et al. | 364/900 |
| 4,040,038 | 8/1977 | Rosier | 340/174 TF |

*Primary Examiner*—Melvin B. Chapnick
*Attorney, Agent, or Firm*—Jackson E. Stanland

[57] ABSTRACT

A relational data base system utilizing magnetic bubble domain storage. The bubble domain storage is located on a magnetic chip and includes storage circuitry for storing bubble domains in columns and rows. The bubble domains are coded to represent data, and the rows and columns of bubbles correspond to tables of data which are determined by various relations. Current activated transfer gates located on the magnetic chip are used to select a particular row or a particular column of bubble domains for accessing. The magnetic chip also includes a write circuit for writing bubble domains into storage and a read circuit for reading bubble domains removed from storage. Located off the magnetic chip are column addressing circuits, row addressing circuits, interface circuitry, and a computer central processing unit. The interface circuitry is located between the central processing unit and the bubble domain storage chip, while the column and row addressing circuits provide inputs to a transfer control circuit that is used to activate selected current carrying lines when it is determined to access a particular row or column of bubbles in storage. New information can be entered into any of the stored tables of bubble domains, and information can be removed from any of the stored tables. Also, new tables of information can be provided in storage by combining selected rows or columns of tables already in storage.

14 Claims, 10 Drawing Figures

FIG. 2

PARTS LIST (R1)

| PART NUMBER | PART NAME | COLOR |
|---|---|---|
| 100 | PAPER | WHITE |
| 200 | PEN | BLACK |
| 300 | SCREW | RED |

FIG. 3

MANUFACTURING RESPONSIBILITY (R2)

| PART NUMBER | DEPT. | MANAGER |
|---|---|---|
| 100 | 20 | JOHNSON |
| 200 | 25 | SMITH |
| 300 | 30 | JONES |
| 400 | 35 | DOE |
| 500 | 40 | WARREN |

FIG. 4

JOINED TABLES (R3)

| PART NUMBER | PART NAME | COLOR | DEPT. | MANAGER |
|---|---|---|---|---|
| 100 | PAPER | WHITE | 20 | JOHNSON |
| 200 | PEN | BLACK | 25 | SMITH |
| 300 | SCREW | RED | 30 | JONES |
| 400 |  |  | 35 | DOE |
| 500 |  |  | 40 | WARREN |

MAGNETIC BUBBLE DOMAIN RELATIONAL DATA BASE SYSTEM

BACKGROUND OF THE INVENTION

1. Field of the Invention

This invention is directed to a magnetic bubble domain relational data base system, and in particular to such a system having bubble domain storage which can be selectively accessed in a number of ways to implement various operations required in a relational data base system.

2. Description of the Prior Art

The use of data in a relational data base system is described in an article by E. F. Codd, beginning at page 377 of the June 1970 Communications of the ACM, Volume 13, No. 6. In contrast with conventional data base systems which generally use some form of hierarchical structure where the storage and retrieval of items of information are dependent upon a previously determined key reference which has to be used for accessing data and for writing data back into the memory, a relational data base system does not organize data in a rigid fashion. Many different sets, or relations, of data may be stored in an array where accessing of any of the sets of data may be accomplished by simply naming the relation and those domains of the relation that are desired.

Relational data base systems are an attempt to simplify the user's view of information in the entire data base. In this system, a relation is viewed as a table of columns and rows. For example, a table entitled "Parts List" may contain columns headed "Part Number", "Part Name", "Color", "Weight". The "relation" is the table entitled "Parts List", while the various column headings are the attributes within the table itself. Another table may include as a column therein one of the columns in the first table. Thus, the attribute "Part Number" may be a portion of another table.

From the user's point of view the data base is a collection of relations, or tables. A user can use common attributes to obtain additional relations. That is, the user can look to a common attribute (such as "Part Number") which appears in two tables and then construct another table comprised of columns from the first and second tables. In this way, a new relationship can be established which is a new table having columns which previously were not combined in any single table. In this manner, the number of relations is increased.

Other articles dealing generally with relational data bases include the following:
1. C. S. Lin et al, ACM Transactions on Data Base Systems, Volume 1, No. 1, March 1976, pp. 53–65.
2. E. A. Ozkarahan et al, National Computer Conference, 1975, pp. 379–387.
3. Computer Systems Research Group, University of Toronto, Toronto, Canada, Report M5S1A4 (to appear as No. 30 of ENGINEERING FORUM, a publication of the faculty of Applied Science and Engineering of the University of Toronto, Toronto, Ontario, Canada).

The present invention seeks to utilize magnetic bubble domain storage as a key component in a data base management system. More particularly, the present invention is directed to apparatus for using relational data bases with bubble domain storage, where the natural attributes of two-dimensional bubble storage can be utilized advantageously. In order to do so, two types of known bubble domain storage, a major/minor loop storage and the bubble lattice storage, are utilized as illustrative examples. Bubble domain major/minor loop storage is described in U.S. Pat. No. 3,618,054 and also in U.S. Pat. No. 3,879,585. The bubble lattice storage is described in copending application Ser. No. 632,604 filed Nov. 14, 1975 (now U.S. Pat. No. 4,052,710) which is a continuation of Ser. No. 395,336 filed Sept. 7, 1973 and assigned to the common assignee. In addition, this type of bubble domain storage has been described by B. A. Calhoun and others at the 20th Annual Conference on Magnetism and Magnetic Materials, Dec. 3–6, 1974, San Francisco, Calif., (papers 7D-1, 7D-2, 7D-3, 7D-4).

Prior art relating to magnetic bubble domain systems has been largely directed to conventional types of storage systems where data is stored and retrieved by fixed addresses. An attempt to utilize bubble domains for data management is described in copending application Ser. No. 556,378, filed Mar. 7, 1975 (now U.S. Pat. No. 4,040,018) in the name of H. Chang et al, and assigned to the present assignee. In that application, data management can be provided by a plurality of shift registers which are linked by binary switches. These switches enable two streams of data to either cross one another non-destructively or to bypass one another. In this manner, a variety of data structures can be provided, such as last in - first out, and first in - first out, as well as dynamic rearrangement of data items.

Accordingly, it is a primary object of the present invention to provide a magnetic bubble domain relational data base system.

It is another object of this invention to provide a system utilizing the natural features of magnetic bubble domain storage for performance of data operations using relational data base algebra.

It is another object of the present invention to utilize two forms of magnetic bubble domain storage in a system in which data is stored and accessed in terms of its relation to other data.

BRIEF SUMMARY OF THE INVENTION

This invention is directed to magnetic bubble domain relational data base systems in which magnetic bubble domain storage has associated with it components for providing relational data base operations. The bubble domain storage organizes tables, or relations, of data arranged in columns and rows, and also includes means for accessing particular tables or relations in storage. Column addressing means are provided to selectively read particular columns in any data relation from the bubble domain storage. Row accessing means is provided for accessing information in any row of a selected table, or relation. Further, means are provided for selecting particular rows or particular columns of the storage for accessing in order to obtain information from any of the tables of data which are stored. An interface means is provided between a central processing unit, such as an IBM Type 370 Model 3145, and the circuits used to control the bubble domain storage. If desired, buffer registers which are part of the interface means can be bubble domain storage registers.

This system does not organize data in a rigid fashion and many different tables of data may be stored in the bubble domain storage in an array where accessing of any of the tables of data is accomplished by simply naming the table and those columns of the table that are desired. Further, more than one table having common attributes can be joined to form a new table or relation of data items which had not been previously related.

A major/minor loop bubble domain storage and a bubble lattice file are illustrated as two types of bubble domain storage which can be utilized in this system.

These and other objects, features, and advantages will be more apparent from the following more particular description of the preferred embodiments.

BRIEF DESCRIPTION OF THE DRAWINGS

FIGS. 2 and 3 illustrate two relations (parts list and manufacturing responsibility) which might be used to describe a manufacturing plant, while FIG. 4 shows a relation (joined tables) which was developed by utilizing the common attribute (part number) of the relations in FIGS. 2 and 3.

DETAILED DESCRIPTION OF THE PREFERRED EMBODIMENTS

FIG. 1

Figure 1:
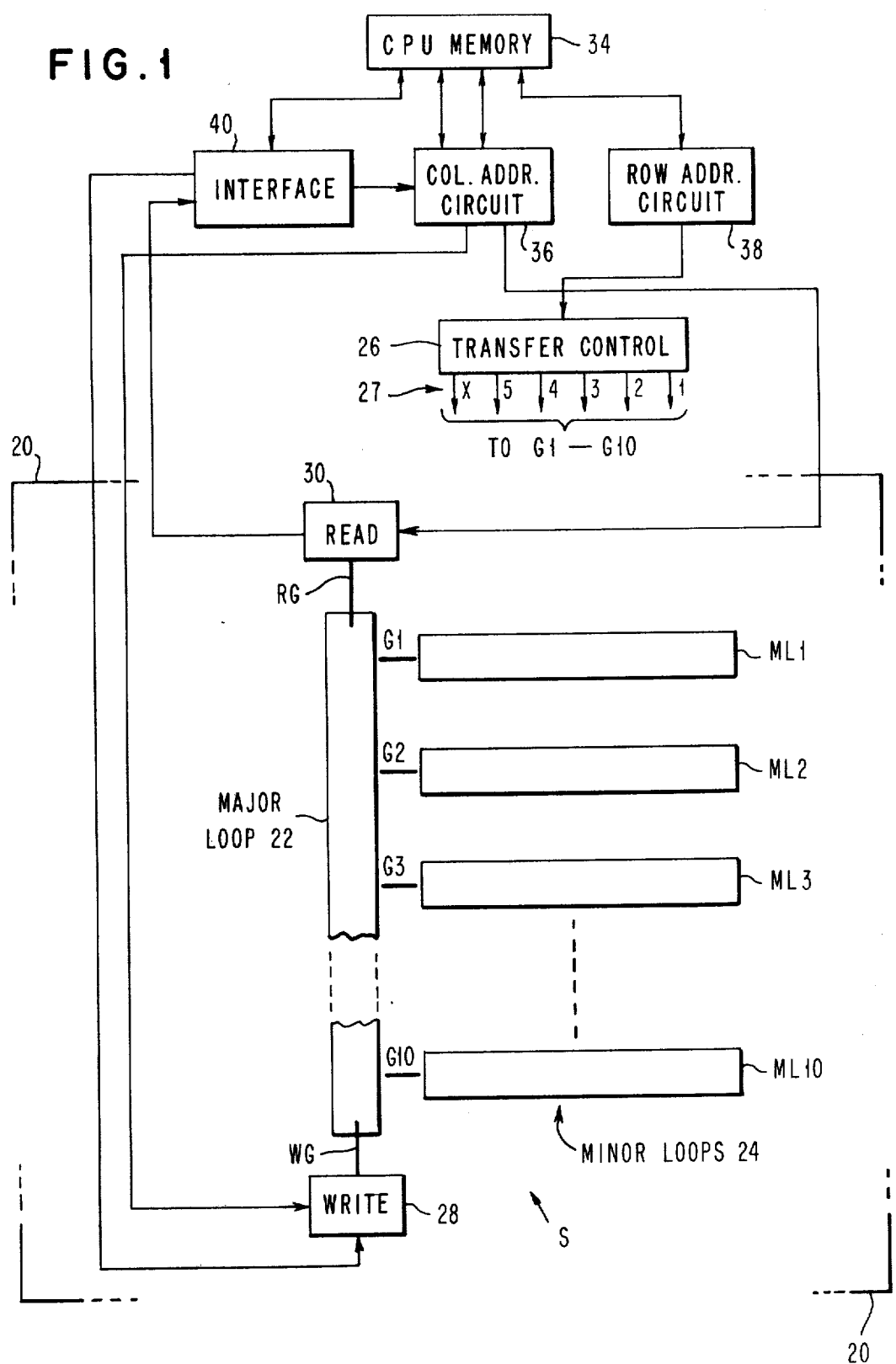
FIG. 1 is a block diagram of a magnetic bubble domain relational data base system, using a major/minor loop type of bubble domain storage.

FIG. 1 shows a block diagram of a magnetic bubble domain system which can be used to implement data storage and management in accordance with relational data base operations. The system is comprised of a magnetic bubble domain medium 20 having a magnetic bubble domain storage device S located thereon. In this figure, the bubble storage device is a major/minor loop system having a major loop 22 and a plurality of minor loops 24, designated ML1, ML2, . . . ML10. Depending upon the amount of storage required, the number of minor loops and their length can be varied in accordance with well known principles. The major loop 22 and minor loops 24 are interconnected by various transfer gates G1, G2, . . ., G10. Depending upon the inputs received from transfer control circuit 26 via transfer control lines 27, information transfer can occur between major loop 22 and any, or all, of the minor loops 24. In particular, the transfer control 26 and transfer gates G1–G10 allow columns of information and rows of information to be selectively removed from the minor loop storage area. Since various tables, or relations, of data are stored in the minor loops 24, it will later be appreciated that this ability to selectively remove columns or individual rows from storage enables the system to perform the operations required for relational data base management.

A write circuit 28 is used to write new information into major loop 22, while a read circuit 30 is used to read information in the major loop 22. Write transfer gate WG connects the write circuit 28 to major loop 22, while read transfer gate RG selectively connects read circuit 30 with major loop 22. Write circuit 28 initiates the generation of new information to be placed in storage. Gates RG and WG are conventional devices used in this type of bubble storage.

A central processing unit and associated memory 34 is provided for storage management, retaining a directory of table names and locations, and input/output circuits to interface with the various components used to provide the data relational base operations. Unit 34 communicates with the column address circuit 36 and the row address circuit 38, and also with the interface circuits 40. Column address circuit 36 provides control signals to both read circuit 30 and write circuit 28. Data input to write circuit 28 is provided by interface 40. The row address circuit 38 provides an input to the transfer control 26.

In operation, the column address circuit 36 controls the column of information to be removed from the minor loops 24, while the row address circuitry 38 determines which rows of information will be removed from the tables which are stored in the minor loops 24. The data management control functions for determining the flow of data are achieved through the central processor unit 34. In order to interface properly between the high speed memory circuits of unit 34 and the slower storage circuits, interface circuit 40 is provided. Interface circuit 40 contains data pack/unpack circuits and various buffer registers, which could be bubble domain storage registers.

The system of FIG. 1 can be used to store various relations and to insert, delete, or modify information using relational data base operations.

THE RELATIONAL VIEW OF DATA (FIGS. 2, 3, 4)

A data base is a structured collection of commonly pooled data which is accessible by concurrent users through computer systems. Traditional computer approaches to implementing earlier versions of data bases were to provide users a collection of file processing programs. The data for the applications were stored in computer files on secondary storage devices and were directly manipulated by programs of the application. Applications implemented this way were intimately tied to the minute details of computer operations and specific storage devices. As more applications were demanded, the number of specialized files increased, causing many problems. In order to alleviate these problems, the concept of data base management systems evolved. These systems aim at creating data bases that have an existence separate from the specific applications that use them. They are complex integrations of computer software and hardware which attempt to provide their users with a "logical view" of a data base that will insulate users from the details of data storage and manipulation. A query language is also available by which users can readily specify the retrievals and updates of the data stored according to the "logical view".

The relational model of data is one attempt to provide data management. A relation is simply a table of data whose rows contain information which describe a set of similar entities such as persons, places, or things. For example, the relations R1 and R2 shown in FIGS. 2 and 3 may be used to describe a manufacturing plant. The name of the table or relation identifies the set of entities being described, such as "Parts List" and "Manufacturing Responsibility". The names of the colums in each of the relations identify the attributes which are used to describe the characteristics of each entity, for example part number, part name, and color.

Each row of the table, or relation, contains a set of values — one for each attribute — which characterize a particular entity, for example, 200, pen, black. The order in which rows or columns occur is immaterial to the user's logical view of their relations. Thus, a relational data base is composed of a collection of time-varying relations which may change because of modifications, insertions, and deletions.

Data in two or more relations R1 and R2 can be interrelated through common attributes which appear in each of the relations. This allows users to execute queries which have complex selection criteria. For example, to find the part names made by the different departments, reference is made to relations R1 and R2. This is done by noting that these relations have at least one attribute in common: part number. Thus, the department corresponding to the particular part number can be found from R2, while the part name corresponding to a particular part number can be found from R1. Doing this, a joined table (R3) can be formed (see FIG. 4) using as a basis the common attribute (part number) found in R1 and R2. This allows the formulation of a new relation which the user can develop from previously stored relations. The operation of selecting a particular attribute (column) and reading out this information is called "projection". The operation wherein two relations R1 and R2 are combined through a common attribute to produce a new relation R3 is called "join". Thus, these relationships require that information be read from storage column-wise and also row-wise to satisfy any query, such as a query which asks "What department makes part number 300?". These capabilities must be provided by the bubble domain system established to perform relational data operations.

The relational model provides users a view of data that is simple, consistent, and yet computationally complete with respect to data processing requirements. Other types of logical data base views, such as hierarchies and networks, can be constructed from relations. The languages, such as query-by-example, for manipulating relational data bases are simple and yet powerful.

STORAGE OF RELATIONS (FIG. 5)

Figure 5:
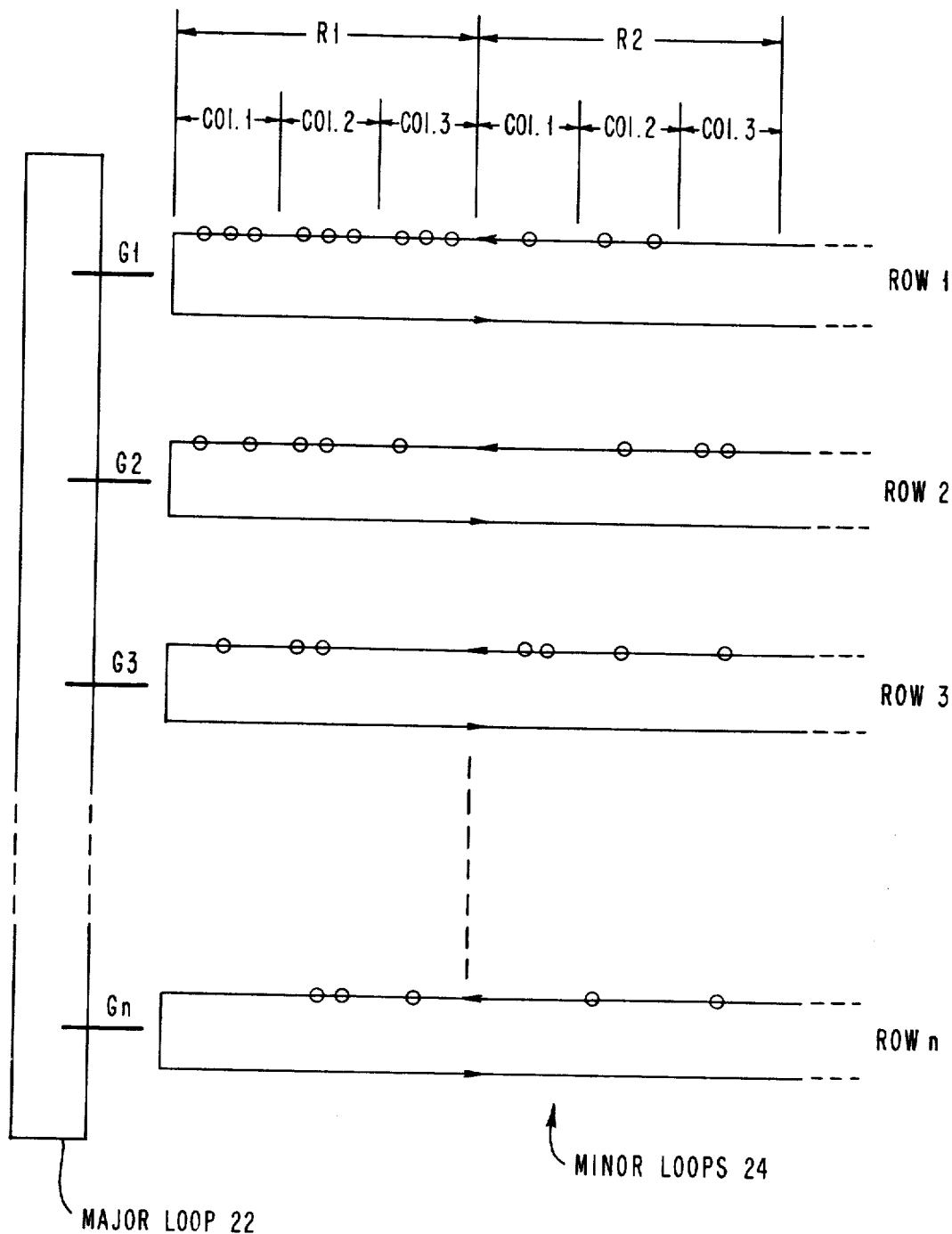
FIG. 5 is an illustration of the storage of the relations of FIGS. 2 and 3 in the bubble domain system of FIG. 1.

FIG. 5 shows the organization of the data relations in a major/minor loop memory, such as the type illustrated in FIG. 1. The major loop 22 and minor loops 24 are shown schematically in this figure. Depending upon the number of rows in the relations to be stored, more or less minor loops 24 can be provided. Each minor loop contains a row of binary data corresponding to the entities in each column. If there are more rows than the total number of minor loops, the table may be folded up and the first minor loop used to store the first, $(n+1)^{st}$, ... and so on, rows.

When a column is to be accessed, a transfer control circuit 26 (FIGS. 1 and 6) moves the column from the minor loops 24 to the major loop 22. Information is then carried by the major loop to a read circuit 30 (FIG. 1). This is a conventional transfer operation in major/minor loop bubble memories. When a "row" access is required, a subset m out of n control lines (FIG. 6) is activated to select a particular minor loop. Upon shifting, the required row is transferred to the major loop 22 for output. Thus, this organization will provide selective column or row accessing in order to access columns or rows of the relations which are stored in the memory. Advantage is taken of the two-dimensional storage possibilities of bubble domain devices and in particular those which have been adapted to provide accessing not generally used in conventional storage organizations.

DETAILED APPARATUS (FIGS. 6-8)

Figure 6:
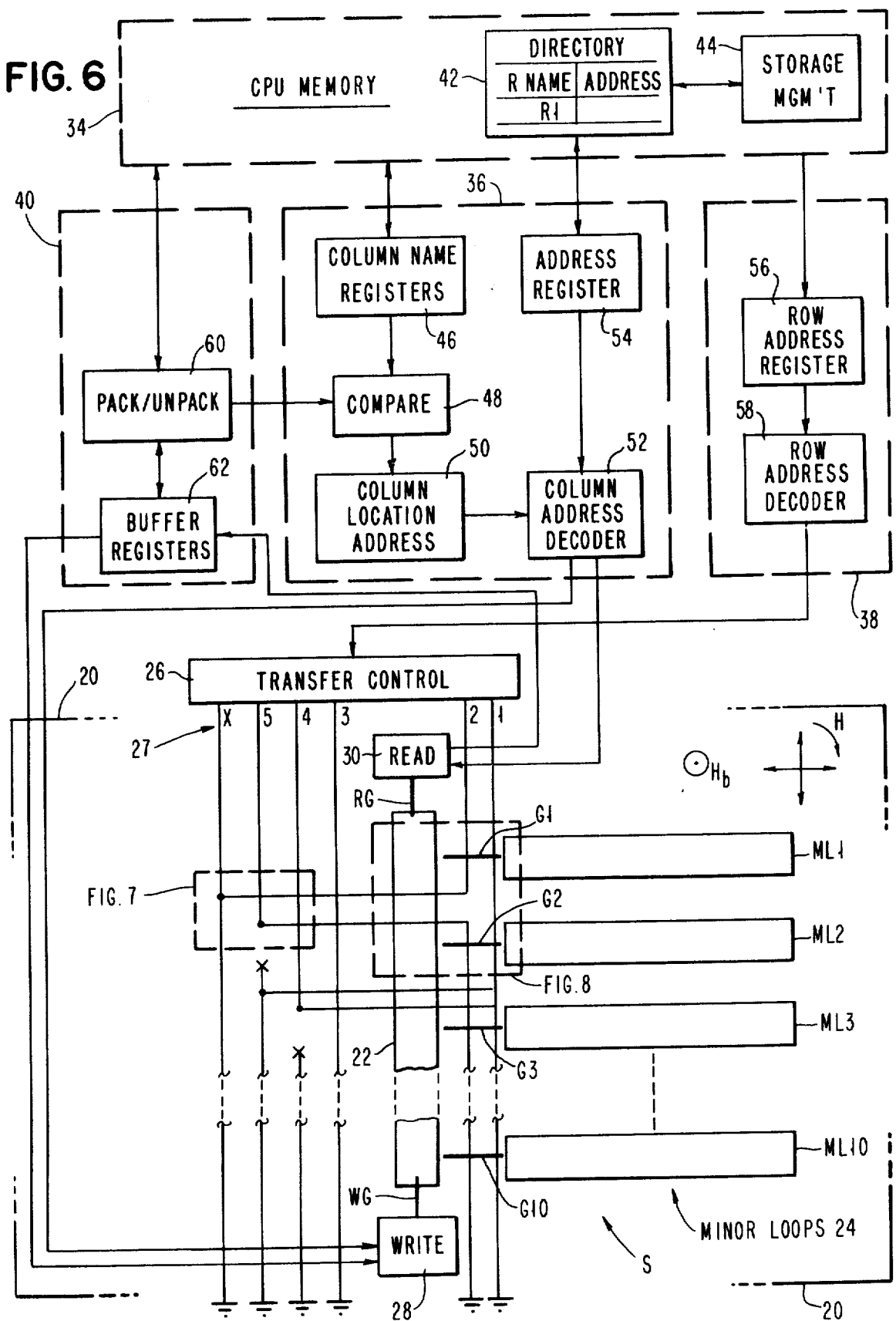
FIG. 6 is a more detailed diagram of the bubble domain relational data base system of FIG. 1, showing the various control circuits that are required.
Figure 8:
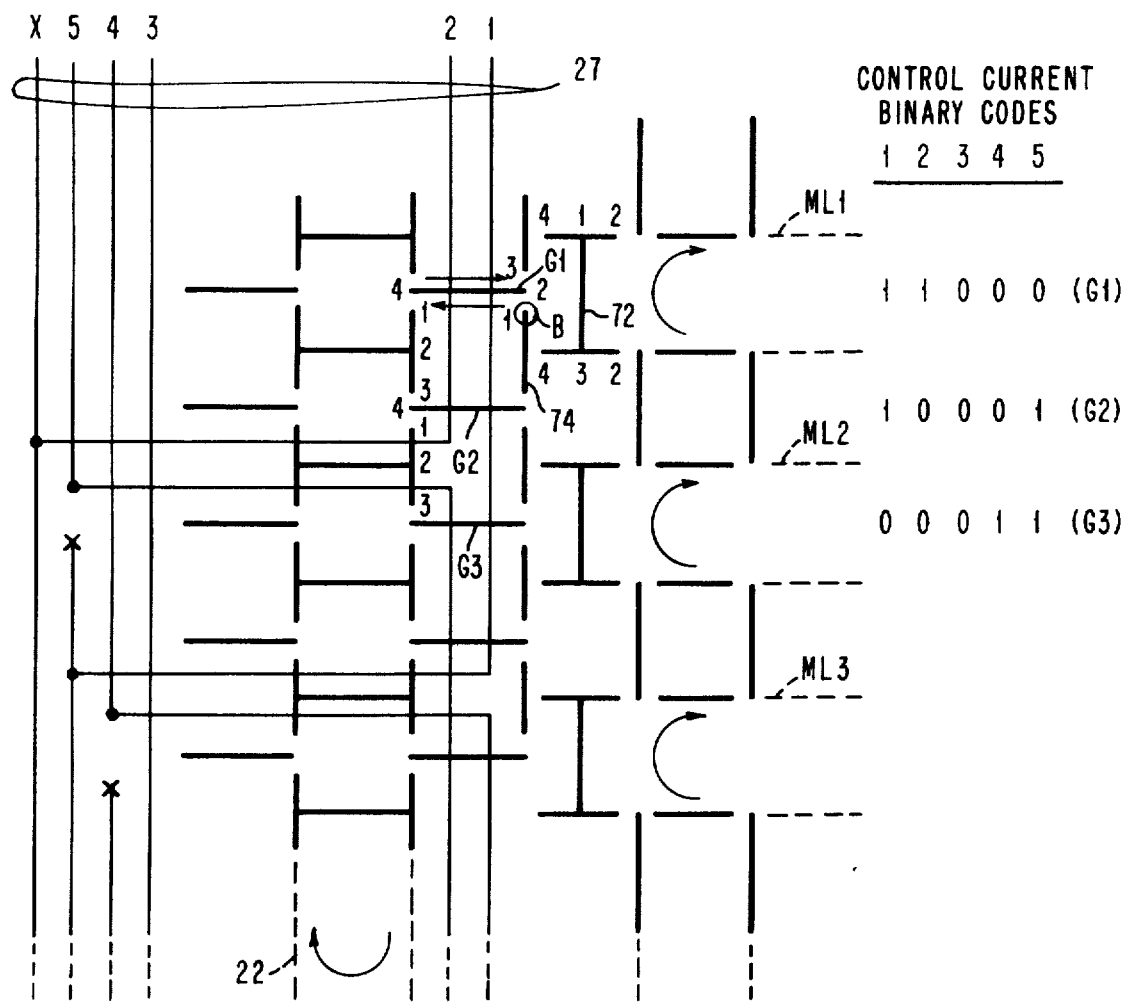
FIG. 8 shows a detailed embodiment using magnetic overlays which illustrates the operation of the transfer gates G between each of the minor loops and the major loop during bubble domain transfer.

FIG. 6 expands the circuitry shown schematically in FIG. 1 to illustrate the components in the column address circuit 36, row address circuit 38, interface circuit 40, and CPU memory 34. Additionally, the transfer control lines from transfer control circuit 26 are shown in more detail. Portions of the circuit of FIG. 6 are shown in FIG. 8.

Only a portion of the central processing unit and memory 34 is shown in this figure. In particular, a directory 42 contains the beginning and ending address of each of the relations R1, R2, etc. Directory 42 is used to locate the relations which are to be addressed in the minor loop storage 24. Associated with directory 42 is storage management circuitry 44, which contains the software required for control functions. Storage management 44 communicates with the directory to keep track of the control functions for management of the data. These circuits in the central processing unit are well known in the art and are generally associated with information handling systems.

The column address circuit 36 includes column name registers 46, a compare circuit 48, column location address circuit 50, column address decoder 52, and address register 54. The purpose of the column address circuit is to provide addresses for columns in any particular relation which are to be projected, i.e., transferred out of the minor loops 24 and read out from the major loop 22. Data flow connections exist between CPU memory 34 and the column name registers 46 and address register 54. Thus, when a particular relation is located using directory 42 and address register 54, a particular column within this relation can be addressed using column name registers 46, compare circuit 48, column location address circuit 50, and the column address decoder 52. The column address decoder provides an input to the write circuit 28 and to the read circuit 30 in order to read out a column of information in the selected relation and to write in new information into the column if such is needed.

The row address circuit 38 generally comprises a row address register 56 and a row address decoder 58. A communications link exists between CPU memory 34 and the row address register. Depending upon the address of a particular row in any relation stored in the minor loops, the row address decoder will select one of these row addresses and provide the address to the transfer control circuit 26. Depending upon the presence of control currents in selected ones of the transfer control lines 1, 2, . . . 5, X, any one of the minor loops can be selected for transfer of information to the major loop 22.

The interface circuit 40 is generally comprised of a pack/unpack circuit 60 and the buffer registers 62. Interface circuit 40 is used to provide an interface between the slower bubble domain storage and the high speed storage in the CPU memory. If desired, the buffer registers 62 can be bubble domain registers located on the magnetic chip 20. The pack/unpack circuit is a conventional circuit used to put information into the buffer registers or into the CPU memory. Interface circuit 40, and specifically circuit 60, provides an input to compare circuit 48 of the column addressing circuit 36. Further, an input is provided from buffer register 62 to the write circuit 28 if new information is to be entered into the major loop 22. An input to buffer register 62 is provided from read circuit 30. This is information which is read from the major loop 22 and is to be entered into the CPU memory, via pack/unpack circuitry 60.

The magnetic field H is an in-plane magnetic field used to move bubble domains in the major and minor loops of the storage device S, and also to move bubble domains in the buffer register 62. The field $H_b$ is the magnetic bias field used to generally stabilize the size of domains in the storage device S.

As will be described in more detail later, the transfer gates G1–G10 are comprised of magnetic bars (such as NiFe) across which various control lines are located. Magnetic poles for transfer of information can be created at the ends of these bars depending upon the current flow in the transfer control conductors. Thus, any transfer gate can be activated for transfer of information in a selected direction by appropriate current pulses on the control lines crossing that gate. This operation will be detailed more particularly with respect to FIG. 8. Further, the physical layout and interconnection of the various transfer control lines is shown in more detail in FIG. 7.

In FIG. 6, the various transfer control lines 27 provide a conductor array which overlies the various transfer gates G1–G10. As will be apparent from FIG. 7, six control lines run vertically while two control lines run horizontally. The vertical and horizontal lines are distributed in two separate planes separated by an insulating layer at places everywhere except those requiring interconnection between the vertical and horizontal lines.

During the usual bubble propagation in response to the rotation of field H, bubble domains continually propagate in the major loop 22 and the minor loops 24. However, when both control lines crossing over any transfer gate are pulsed, the magnetic field generated by both lines is just strong enough to overcome the in-plane field H to switch the horizontal transfer bar in order to attract bubbles from one edge of the bar to the opposite edge. Thus, transfer to the right or to the left occurs upon coincident excitation of properly directed currents in selected transfer lines. In the event that less than two of the control lines crossing over any gate are activated, the horizontal magnetic bar comprising the gate will be solely magnetized by the in-plane field H. In this situation, no transfer of bubbles will occur.

Thus, by appropriately applying current pulses to selected transfer control lines, all gates can be utilized to transfer information, or selected gates can be utilized for information transfer. In this manner it is possible to transfer an entire column from the minor loops 24 to the major loop 22, or an individual row of any relation stored in the minor loops 24.

FIG. 7

Figure 7:
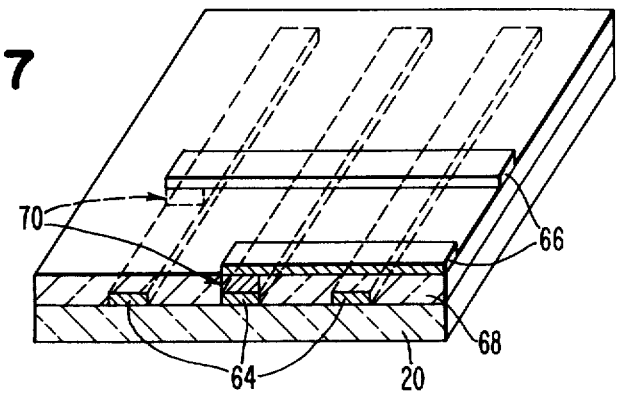
FIG. 7 is a cross-sectional perspective view illustrating the physical arrangements of the various transfer control lines in the system of FIG. 6.

FIG. 7 is a perspective view in cross-section showing the physical placement of the vertical control lines and the horizontal control lines comprising the transfer control lines 27. In this figure, the bubble film 20 has vertical control lines 64 located on the bubble material and horizontal control lines 66 located in a different plane. An insulating layer 68 separates the vertical control lines 64 and the horizontal control lines 66, except at those locations where interconnections 70 are to be made. In this figure, via-hole etching is used as a technique to interconnect the metal lines comprising the vertical control lines 64 and the horizontal control line 66 through the insulating layer 68.

FIG. 8 shows a portion of the bubble domain circuitry, and in particular the major loop 22 and three minor loops ML1, ML2, and ML3. This drawing is used to explain the transfer operation by which data moves back and forth between the major loop 22 and the minor loops 24. Transfer control is achieved by selectively driving m out of n transfer control lines 27 such that the field produced by the sum of the currents moves a bubble from a minor loop to the major loop, and vice versa. For instance, if there are 10 minor loops then it is possible to use five control lines to select any one of the minor loops. In FIG. 8, five transfer lines 1, 2, 3, 4 and 5 are used. As will be explained in more detail later, an extra line marked X is provided.

When both control lines across any transfer gate are pulsed, a magnetic field generated by both lines is just strong enough to overcome the effect of the in-plane field H to switch the horizontal bar to attract bubbles from one edge of the bar to the opposite edge. In this manner, bubbles can be transferred from the minor loops to the major loop. By reversing the polarity of control current, the bubbles can be transferred back to the minor loop from the major loop 22.

If less than two control lines overlying any gate are activated, the horizontal magnetic gate will be solely magnetized by the in-plane field H. When this occurs, no transfer operation is possible.

To achieve the conventional major/minor loop transfer operation, all transfer control lines are activated at the desired time to transfer information from each minor loop to the major loop. In general, if there are n control lines and if m out of n lines are activated at a time, then $\binom{n}{m}$ minor loops can be selected. The transfer control lines can be implemented as $(n+1)$ lines vertically in one layer and two lines horizontally on the second layer for each minor loop, as indicated in FIG. 7. The extra line marked X (FIG. 8) is always used for the outgoing line connection via a horizontal connection from the previous transfer gate G (in FIG. 8 the number 2 control line is the outgoing line after transfer gate G1). The incoming line is connected via another horizontal line and takes over the position of the previous outgoing line at the following transfer gate (in FIG. 8, line number 5 is the incoming line and its position at G2 is the same as the position of line number 2 at G1). The previous transfer line number 5 is disconnected after the horizontal connection and becomes the new extra line marked X. This procedure is repeated for the other transfer gates according to the sequence of the constant-weight codes which has the property that two adjacent codes differ at two positions and require exactly one exchange of one and zero. If there are ten lines and three lines are activated at a time, then a total of 120 minor loops may be selected individually. Clearly, m is restricted by the stability of the threshold field required to overcome the effect of the rotating in-plane field H in order to switch the magnetic bar (NiFe) comprising any transfer gate G.

The main advantage of this transfer network is that the high power of combinatorial selection for accessing a single minor loop is achieved by a one step synchronous operation without introducing an extra delay and/or complicated logic. The operation of the bubble memory has other applications such as transposition of arrays and permutation of array data for encryption, sorting, etc.

Figure 9:
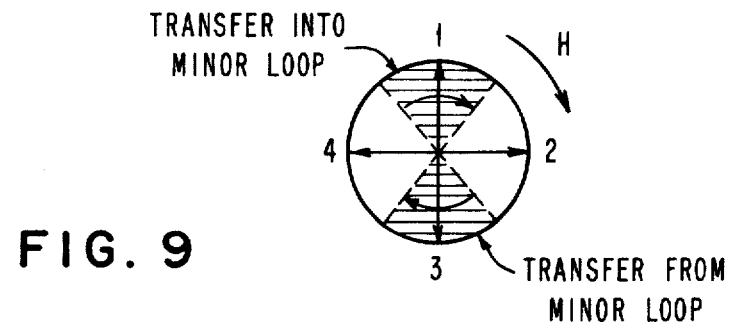
FIG. 9 illustrates the in-plane magnetic field H used to propagate bubble domains using the structure of FIG. 8, and further illustrates the timing for transfer between the major loop and the various minor loops.

In FIG. 8, the numerical designations 1, 2, 3, 4 placed along T-bar 72 in loop ML1 indicate the bubble position in response to the in-plane rotating field sequence shown in FIG. 9. As H rotates, a plurality of bubbles propagate simultaneously in a clockwise direction along the continuous path marked by points 1, 2, 3, 4, 1, 2, . . . in each of the minor loops shown in FIG. 8.

The operation of the transfer gates will be described with respect to the movement of a bubble domain B located at pole position 1 of I-bar 74. During the usual storage operation, the transfer gate G1 is always closed so that bubble B simply moves clockwise along the path 1, 2, 3, 4. To transfer this bubble into the major loop, gate G1 is opened by pulsing vertical control lines 1 and 2 during the field sequence H illustrated in FIG. 9. Bubble B is forced to move from the right end of the horizontal bar G1 to the left-hand end of this bar. The bubble will then continue to propagate downward in the major loop 22 following the path 1, 2, 3, 4 as field H rotates.

A bubble domain located at the left-hand end of transfer gate G1 will be transferred to the right to the minor loop ML1 by applying coincident current pulses in transfer control lines 1 and 2, having opposite polarity to those used to transfer the bubble domain in the opposite direction.

This transfer operation can be realized in other minor loops by properly activating the control lines. In FIG. 8, the combinations of control currents used to activate the transfer gates G1, G2, and G3 are shown. In these control current binary codes, "1" and "0" represent the presence and absence, respectively, of activation in the transfer control lines 1-5. For example, to access information from ML2, only control lines 1 and 5 are activated so that only transfer gate G2 is open.

In FIG. 9, the shaded sections show the time periods in terms of the rotation of field H in which transfer current pulses can be applied to achieve transfer back and forth between any minor loop 24 and the major loop 22. Approximately 60° of field rotation cycle can be used for transfer in either direction.

FIG. 10

Figure 10:
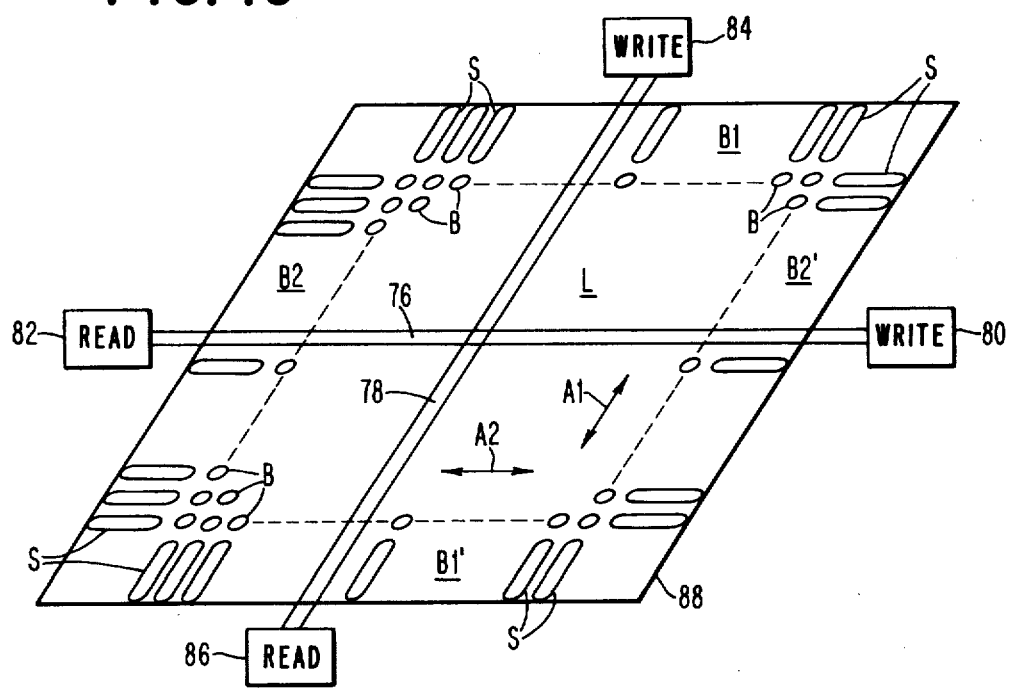
FIG. 10 represents a bubble lattice storage device which can be utilized in a magnetic bubble domain relational data base system of the type previously described. The associated control circuitry, etc., is not shown in this diagram.

FIG. 10 shows another form of bubble domain storage which can be used in the relational data base system of FIG. 1. The storage in FIG. 10 is a lattice storage in which magnetic bubble domains are crowded sufficiently close to one another that they interact with one another. In accordance with principles described in U.S. Pat. No. 3,930,244 and in copending application Ser. No. 429,601, filed Jan. 2, 1974, now U.S. Pat. No. 4,040,038, and assigned to the present assignee, columns of bubble domains can be accessed from the storage lattice for reading.

In more detail, a lattice L contains magnetic bubble domains B which are sufficiently close to one another that interactions therebetween can occur. Located around the lattice L are various buffer zones B1, B1', B2 and B2'. These buffer zones contain stripe domains S whose length can be changed by means (not shown). In accordance with the principles described in U.S. Pat. No. 3,930,244, a change in the length of stripe domains in opposing buffer zones can be used to translate the lattice. Thus, using the stripe domains S in buffers B1 and B1', bubbles in the lattice can be moved upwardly or downwardly along the directions indicated by arrow A1. This provides row translation of bubble domain rows in the lattice.

In a similar fashion, if stripe domains S in buffers B2 and B2' are changed in length, columns of bubble domains can be moved either to the right or to the left in the directions of arrow A2, in order to achieve column translation.

Associated with the lattice is a row access channel 76 and a column access channel 78. Row access channel 76 is connected to a write circuit 80 and a read circuit 82, while column access channel 78 is connected to a write circuit 84 and a read circuit 86. In the manner described in aforementioned copending application Ser. No. 429,601, and in U.S. Pat. No. 3,930,244, columns of bubble domains or rows of bubble domains in the lattice can be moved to locations where they can be removed from the lattice using the column access channel 78, or row access channel 76, respectively.

The bubble domains B in the lattice and the stripe domains S in the buffer zone are generally retained by confinement means 88. This confinement means can comprise any of the well known means for controlling the positioning of bubble domains and stripe domains, such as by providing a high energy boundary for the domains. To do so, the confinement means can be fabricated from current carrying conductors and magnetic materials. Also, changes in the magnetic properties of the bubble domain material can be used, including thickness changes and changes brought about by ion implantation, diffusion, etc.

The structure of FIG. 10 enables column or row access of information stored in the lattice L. Thus, a number of tables, or relations, can be stored in the lattice for removal in accordance with address instructions provided by the circuitry shown in FIG. 1. For example, a projection of any column which is stored is achieved using the column access channel 78. If it is desired to remove a row corresponding to one of the rows of a stored relation, the row access channel 76 is used to remove this row from the lattice. Circuitry can be associated with the lattice of FIG. 10 to provide relational data base operations on bubble domains within the lattice L, in the same manner that this circuitry cooperates with the major/minor loop storage in the apparatus of FIG. 1.

RELATIONAL DATA OPERATIONS

The three operations previously mentioned, i.e., projection, join, and load, will now be described in more detail, particularly with respect to the system of FIGS. 1 and 6.

Projection Operation

In the projection operation, a specified column or columns of a relation are read out from the bubble domain storage S. Redundant duplicate rows are removed. This is accomplished using the following steps:

1. The directory 42 is read to find the beginning and ending addresses of the relation in which a column is to be projected.
2. According to the specified address in the column, column data corresponding to the column is read into the buffer register 62.
3. The projection of the column is stored and the directory 42 is updated, and/or the output is transferred to I/O circuits in the CPU memory 34.

The read operation can be broken down into the following sequence of steps:

a. Relation addresses from directory 42 are decoded into the transfer control 26 in order to select a particular minor loop. The column name is then loaded into the column name register 46 (assuming the beginning address corresponds to the first minor loop).

b. Assuming that the column names for this relation are stored in the first minor loop, transfer control lines 1 and 2 will be pulsed to read out the complete set of domain names into the buffer register 62. After proper unpacking by circuit 60, the location of the desired column is obtained by matching the desired column name with the properly unpacked sequence of column names. This information is stored in a register in the column location address circuit 50.

c. All minor loops are accessed by pulsing all transfer current lines 27. At the proper time determined by the column location address circuit 50 and the decoder 52, the contents of all minor loops corresponding to the specified column of this relation are read into the buffer registers 62.

d. If the projection needs to be stored, the storage management circuit 44 will supply the addresses for the required storage. The addresses will be loaded into the directory 42 which will in turn select the proper minor loop for the write operation. Clearly, for this write operation, all transfer current lines 27 will need to be pulsed.

Load Operation

In a load operation, data is to be entered into the proper minor loops. Further, information is to be read into the directory 42 to update the addresses of data. The following diagram indicates the control flow for direction of data and the actual data flow itself.

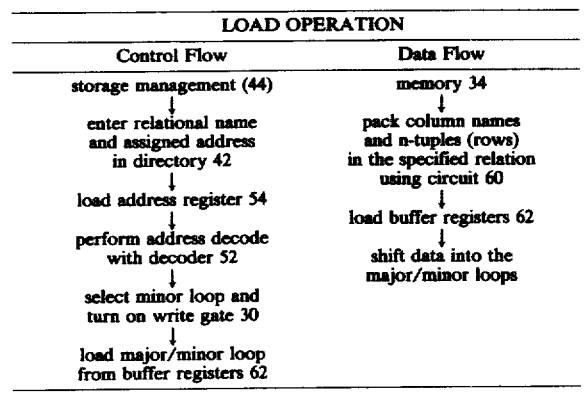

| LOAD OPERATION | |
|---|---|
| Control Flow | Data Flow |
| storage management (44) ↓ enter relational name and assigned address in directory 42 ↓ load address register 54 ↓ perform address decode with decoder 52 ↓ select minor loop and turn on write gate 30 ↓ load major/minor loop from buffer registers 62 | memory 34 ↓ pack column names and n-tuples (rows) in the specified relation using circuit 60 ↓ load buffer registers 62 ↓ shift data into the major/minor loops |

Join Operation

In the join operation, two tables, or relations, are joined over a common column. This was described with respect to FIGS. 2–4. The following diagram illustrates the operation of the system of FIGS. 1 and 6 to perform this type of operation.

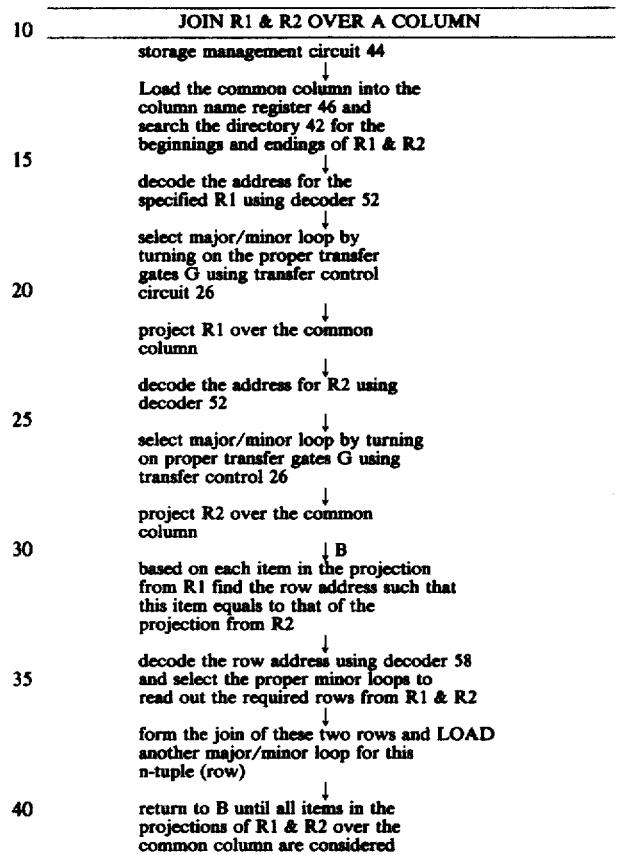

JOIN R1 & R2 OVER A COLUMN storage management circuit 44
↓
Load the common column into the column name register 46 and search the directory 42 for the beginnings and endings of R1 & R2
↓
decode the address for the specified R1 using decoder 52
↓
select major/minor loop by turning on the proper transfer gates G using transfer control circuit 26
↓
project R1 over the common column
↓
decode the address for R2 using decoder 52
↓
select major/minor loop by turning on proper transfer gates G using transfer control 26
↓
project R2 over the common column
↓ B
based on each item in the projection from R1 find the row address such that this item equals to that of the projection from R2
↓
decode the row address using decoder 58 and select the proper minor loops to read out the required rows from R1 & R2
↓
form the join of these two rows and LOAD another major/minor loop for this n-tuple (row)
↓
return to B until all items in the projections of R1 & R2 over the common column are considered What has been described is a bubble domain relational data base system which allows data management according to relational algebra. The attributes of bubble domain storage are utilized to store columns and rows corresponding to different relations. In this storage system, the user can selectively address columns or rows in the stored information in order to use the data for his own purposes. The bubble domain storage is configured so that this can be readily achieved.

It will be readily apparent to others of skill in the art that various modifications can be made to the invention described herein in accordance with the principles presented.

What is claimed is:

1. A magnetic bubble domain relational data base system using bubble domains to represent information, comprising:
   a magnetic medium in which said bubble domains can be stored,
   a bubble domain storage device adjacent to said magnetic medium for storing tables of bubble domains representing tables of related data items, said storage device having shift registers for storing columns and rows of bubble domains corresponding to columns and rows of data in said tables, column access means adjacent to said magnetic medium for accessing selected columns of bubble domains from said storage device,
row access means adjacent to said magnetic medium for accessing selected rows of bubble domains from said storage device including means for accessing an individual row of bubble domain data from said storage device,
control means connected to said column and row access means for determining the addresses of said columns and rows of data in said storage device, and
means connected to said column and row access means and to said control means for forming new tables of said data from said related data items stored in said bubble domain storage device.

2. The system of claim 1, where said bubble domain storage device is a major/minor loop device having minor loops for storage of information in tables and a major path used for input/output and having gate means for controllably accessing selected tables of data stored in said device, said gate means including magnetic gates located between said major path and each said minor loop and transfer control lines overlying said magnetic gates for determining the state of said gates in accordance with the electrical currents in said transfer control lines.

3. The system of claim 2, where said gate means is connected to said control means.

4. The system of claim 1, where said control means includes row address registers and a row address decoder for storing the addresses of rows of bubble domains in said storage device and for selecting particular addresses of rows of said bubble domains, said row address decoder being connected to said row access means.

5. The system of claim 4, further including column address registers for storing the addresses of columns of bubble domains stored in said storage device and a column address decoder for selecting addresses of particular columns of bubble domains to be accessed from said bubble domain storage device.

6. The system of claim 5, including buffer registers for interfacing between said bubble domain storage device and said control means.

7. A magnetic bubble domain relational data system, comprising:
control means including a central processing unit for organizing data in tables having rows and columns in accordance with the relation between data items, said control means further including means for determining the addresses of columns and rows in each said table of related data items,
a magnetic bubble domain storage device for storing said tables of related data items in accordance with the addresses of columns and rows in said tables, said data being represented by said bubble domains which are stored in rows and columns to form tables of bubble domains,
interface means located between said control means and said bubble domain storage device for buffering data flow between said control means and said storage device,
accessing means under control of said control means for accessing selected columns or rows of bubbles in said bubble domain storage device, and
means responsive to signals from said control means for extracting data items from at least two different tables of data items stored in said bubble domain storage device and means for joining said extracted data items from said two tables to form a new table of related data items.

8. The system of claim 7, where said accessing means includes transfer gates in said bubble domain storage device and transfer control means external to said bubble domain storage device for operating all said transfer gates simultaneously or selected gates individually.

9. The system of claim 8, further including means for maintaining a directory of the tables of related data items and means for addressing bubble domains in selected tables in said storage device in response to address signals provided by said control means.

10. The system of claim 9, where said bubble domain storage device is a two-dimensional bubble storage device for storing columns and rows of data items represented by said bubble domains in accordance with the relation between data items determined by said control means.

11. The system of claim 10, where said two-dimensional bubble domain storage device is a major/minor loop storage device having at least one major path for bubble domains and a plurality of minor loops for storage of information represented by said bubble domains and including means for storing bubble domains in tabular form in said minor loops.

12. The system of claim 10, where said two-dimensional bubble storage device is a magnetic bubble lattice file including means for storing bubble domains in columns and rows and further means for extracting selected columns and rows of bubble domains from said lattice file.

13. The system of claim 10, further including means for reading data removed from said bubble domain storage device and write means for writing new columns and rows of data into said tables of bubble domains stored in said bubble domain storage device.

14. In a relational data base system for storing data items in accordance with the relation between data items, including means for determining relationships between data items and means for storing data items in rows and columns to form stored tables of data items, and further including addressing means for determining the addresses of said rows and columns of data items and access means for accessing data items in selected rows and columns in said storing means, together with means for forming new tables of data in said storing means where said new tables are comprised of rows or columns of data in said stored tables of data, the improvement comprising:
a magnetic bubble domain storage device comprising a magnetic film in which bubble domains can be moved and a plurality of shift registers in which said bubble domains can be propagated to achieve storage thereof,
at least one major path along which said bubble domains can propagate,
transfer gate means located between at least one major path and said shift registers for transferring bubble domains between said at least one major path and said shift registers, said transfer gate means being responsive to electrical signals provided thereto for determining whether said domains are transferred between said at least one major path and said shift registers,
transfer control means located external to said bubble domain storage device for providing said electrical signals to said transfer gate means to control the transfer of information between said at least one major path and said shift registers, said transfer control means including current carrying conductors overlying each said transfer gate means for controlling said transfer of bubble domains, where said transfer control means provides electrical currents on said current carrying conductors in accordance with signals received from said addressing means external to said bubble domain storage device, write means located on said magnetic bubble domain storage device for writing bubble domains to be transferred via said transfer gate means to said shift registers, said write means producing said bubble domains for transfer to said shift registers in accordance with signals received from said address means located external to said bubble domain storage device, and read means located on said bubble domain storage device for reading information represented by said stored bubble domains from said shift registers.

* * * * *